United States Patent [19]

Tomatsu et al.

[11] Patent Number: 5,747,851
[45] Date of Patent: May 5, 1998

[54] SEMICONDUCTOR DEVICE WITH REDUCED BREAKDOWN VOLTAGE BETWEEN THE GATE ELECTRODE AND SEMICONDUCTOR SURFACE

[75] Inventors: Yutaka Tomatsu, Okazaki; Mitsuhiro Kataoka, Kariya, both of Japan

[73] Assignee: Nippondenso Co., Ltd., Kariya, Japan

[21] Appl. No.: 723,804

[22] Filed: Sep. 30, 1996

[30] Foreign Application Priority Data

Sep. 29, 1995 [JP] Japan ................................. 7-253940
Jun. 20, 1996 [JP] Japan ................................. 8-159716

[51] Int. Cl.$^6$ ..................... H01L 29/76; H01L 29/94; H01L 31/062
[52] U.S. Cl. ........................ 257/330; 257/331; 257/341
[58] Field of Search ........................ 257/330, 331, 257/332, 333, 334

[56] References Cited

U.S. PATENT DOCUMENTS 5,460,985  10/1995  Tokura et al. ................. 437/40
5,470,770  11/1995  Takahashi et al. ................. 437/41

FOREIGN PATENT DOCUMENTS 62-012167  1/1987  Japan.
93/03502   2/1993  WIPO.

OTHER PUBLICATIONS

Tokura et al: "Concave-DMOSFET: A New Super-Low On-Resistance Power MOSFET", Jpn J. appl. Phys., vol. 34 No. 2b (1995), pp. 903–908.

Tokura et al: "The DMOS Consisting of Channel Region Defined by LOCOS (LOCOS-DMOS): A New Process/Device Technology for Low On-Resistance Power MOSFET," 5th International Symposium on Power Semiconductor Devices and ICs, May 18–20, 1994, pp. 135–139.

Tokura et al: "Concave-DMOSFET: A New Super Lon On-Resistance Power MOSFET", 1994 International Conference on Solid State Devices and Materials, Aug. 23–26, 1994, pp. 736–765.

Sakai et al: "Method to Improve the Surface Planarity of Locally Oxidized Silicon Devices", J.Electrochem. Soc.: Solid-State Science and Technology, Feb. 1977, pp. 318–320.

*Primary Examiner*—Wael Fahmy
*Attorney, Agent, or Firm*—Cushman Darby & Cushman IP Group of Pillsbury Madison & Sutro LLP

[57] ABSTRACT

A concave type DMOS transistor structure can attain improvement in a life-time of a gate insulating film. An initial groove portion is thermally oxidized with a silicon nitride film as a mask. A LOCOS oxide film is formed by this oxidation; concurrently, a U-groove is formed due to the erosion of the surface of an epitaxial layer by the LOCOS oxide film, and moreover the configuration of the groove is fixed. At this time, an inlet corner portion of the initial groove formed by chemical dry etching remains as a curving portion at a sidewall surface of the groove. Thereafter, a gate insulating film is formed, but thickness of the gate insulating film is controlled to be thicker on a groove inlet-portion side than on a groove bottom-portion side, with the curving portion as the boundary.

22 Claims, 9 Drawing Sheets

5,747,851

SEMICONDUCTOR DEVICE WITH REDUCED BREAKDOWN VOLTAGE BETWEEN THE GATE ELECTRODE AND SEMICONDUCTOR SURFACE

CROSS REFERENCE TO RELATED APPLICATION

This application is based upon and claims the benefit of priority of the prior Japanese Patent Application No. 7-253940 filed on Sep. 29, 1995 and No. 8-159716 filed on Jun. 20, 1996, the contents of which are incorporated herein by reference.

BACKGROUND OF THE INVENTION

1. Field of the Invention

The present invention relates to a semiconductor device employed as a semiconductor element for power use, i.e., a vertical type power MOSFET (metal oxide semiconductor field-effect transistor) and IGBT (insulated gate bipolar transistor), and may be utilized in a MOS-IC or the like incorporating for example a semiconductor element for power use.

2. Related Arts

A structure forming a groove in an element surface and forming a channel portion in a side surface of the groove are known as a vertical type power MOSFET according to the prior art, as disclosed for example in Japanese Patent Application Laid-open No. 62-12167 and in International Publication No. PCT WO93/03502.

The vertical type power MOSFETs of the foregoing Japanese Patent Application Laid-open No. 62-12167 and International Publication No. PCT WO93/03502 have a U-groove formed by employing wet etching to form an initial groove having an entrance substantially perpendicular (approximately 70° to 90°) to the substrate, causing LOCOS oxidation (selective oxidation) of this initial groove, and etching away this LOCOS oxide film. The U-groove configuration of these is termed a bathtub configuration in contradistinction to a trench configuration.

Accordingly, since the U-groove formed by the above-described method does not employ, in forming the initial groove, R.I.E. (reactive ion etching) of dry etching which causes ions to physically collide against the semiconductor surface, there exists an advantage wherein occurrence of a lattice defect in the etched surface is difficult, and a decline in carrier mobility can be prevented.

However, it was understood from experimentation performed by the present inventors that a resultant groove structure which is formed by the combination of the above-mentioned etching for forming an initial groove, LOCOS oxidation of this initial groove and removing this LOCOS oxide film does not assume a groove structure resembling the original initial groove (a structure wherein the initial groove is simply enlarged). That is to say, it became apparent that a curve portion (see 710 in FIG. 2) having a small radius of curvature remained when the LOCOS oxide film, at the portion where the above-described entrance which is the boundary of the substrate surface and the initial groove is oxidized, was etched away.

Furthermore, it was discovered that, because a gate insulating film is formed on the substrate surface and along the U-groove surface including the foregoing curve portion and a gate electrode is formed on this gate insulating film so as to include this curve, an electrical field is concentrated in a vicinity of this curve portion during the actual usage, and the gate-to-semiconductor breakdown voltage between the U-groove surface including the curve portion and the gate electrode was reduced.

Moreover, it was discovered that the life-time of the gate insulating film was shortened due to dielectric breakdown occurring between the U-groove surface including the curve portion and the gate electrode.

SUMMARY OF THE INVENTION

Accordingly, in light of the foregoing problem points, it is an object of the present invention to provide a semiconductor device which can prevent a local electrical-field concentration with regard to a gate electrode formed along a U-groove surface.

To attain the above object, a semiconductor device according to the present invention comprises: a semiconductor substrate having a first conductivity type semiconductor layer at a side of a main-surface thereof; a groove structure formed at the main-surface and having a bottom part, a slanting inlet part where the main-surface of the semiconductor layer sinks gradually to the bottom part, and a sidewall part forming a sidewall of the groove structure and joining the slanting inlet part and the bottom part, wherein a curving portion where the slanting inlet part and the sidewall part are inflectionally connected is formed at a boundary of the slanting inlet part and the sidewall part; a gate insulating film formed along the groove structure; and a gate electrode disposed along the groove structure and on the gate insulating film. Herein, the semiconductor device according to the present invention is further characterized in that: the gate insulating film has a first interface defined with an inner surface of the groove structure and a second interface defined with a lower surface of the gate electrode; and the gate insulating film is formed such that a radius of curvature in a vicinity of the curving portion on the second interface is controlled to be larger than a radius of curvature of a portion contiguous to the curving portion on the first interface.

According to the above-mentioned configuration of the gate insulating film, since, near the undesirably caused curving portion, the radius of curvature on the second interface of the gate insulating film is established to be larger than the radius of curvature on the first interface, electric-field concentration at a gate electrode on the curving portion is alleviated, and reduction of breakdown voltage between the semiconductor surface and the gate electrode can be prevented. Additionally, the life-time of the gate insulating film can be improved.

The above-mentioned configuration of the gate insulating film can be obtained by forming the gate insulating film so that a first part of the gate insulating film formed to extend from the curving portion to the slanting inlet part of the groove structure has a thickness thicker than that of a second part formed on the bottom part and the sidewall part of the groove structure and is formed continuously with the second part. That is to say, with the curving portion as a boundary, the film thickness of the first part of the gate insulating film is greater than the film thickness of the second part thereof. In accordance with this, the curvature of the surface (the second interface) of the gate insulating film at the curving portion becomes small, or the radius of curvature thereat becomes large.

It is to be noted that a MOS transistor structure is formed so that a body region of a second conductivity type is disposed on the sidewall part of the groove structure, and a source region of the first conductivity type is disposed within the body region with a channel defined at the sidewall part of the groove structure.

It is preferable that the groove structure has a bathtub configuration, i.e., the sidewall thereof is canted with respect to the main-surface of the semiconductor layer and the sidewall part and the bottom part are joined by a round surface. Because of this, reduction in carrier mobility at the channel is prevented and the ON-resistance is caused not to be reduced, and along with this, an electric-field concentration at a boundary of the sidewall part and the bottom part is alleviated, and so dielectric breakdown strength of this portion is enhanced, and thereby the life-time of the gate insulating film can also be improved.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS

An embodiment according to the present invention will be described hereinafter with reference to the drawings.

Figure 1A:
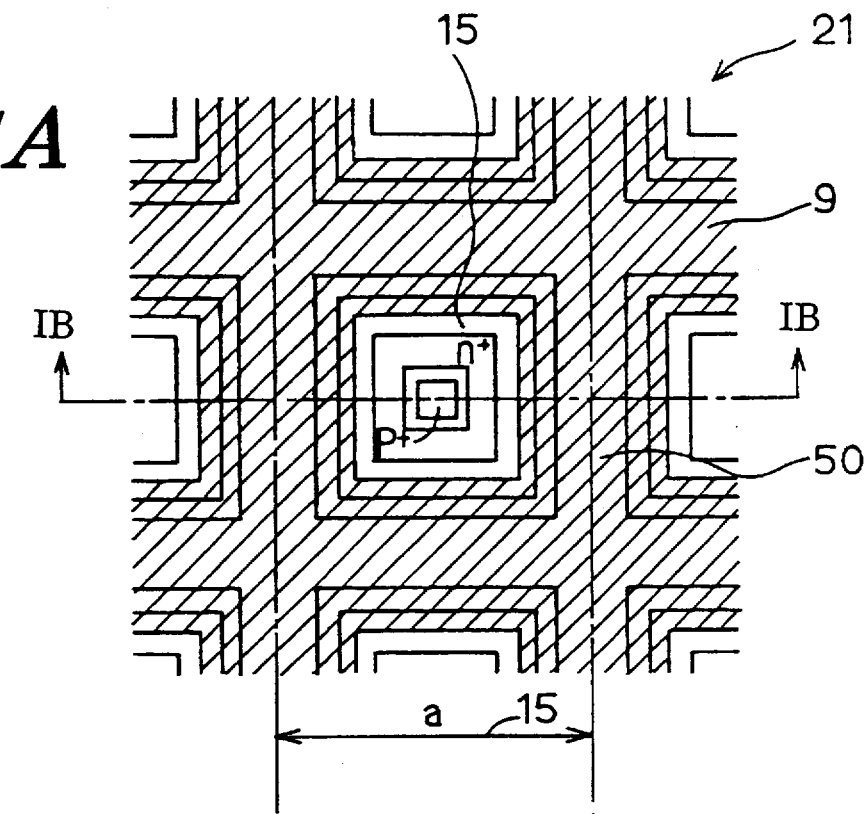
FIG. 1A is a plan view indicating a portion of a vertical type power MOSFET according to an embodiment of the present invention.
Figure 1B:
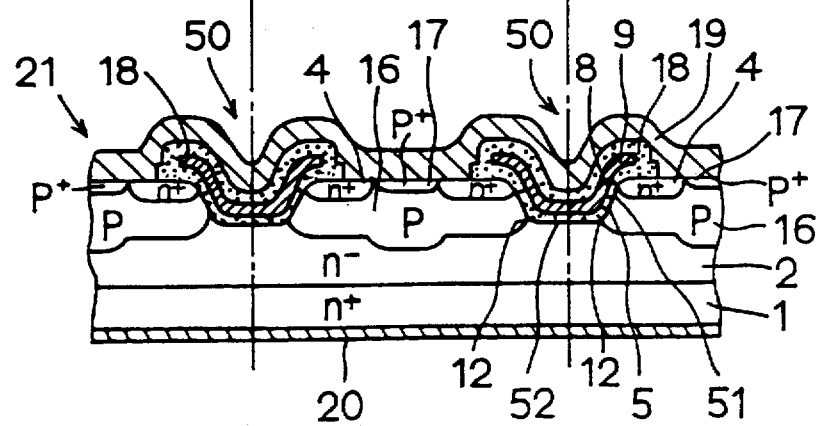
FIG. 1B is a sectional view taken along line IB—IB of FIG. 1A.
Figure 2:
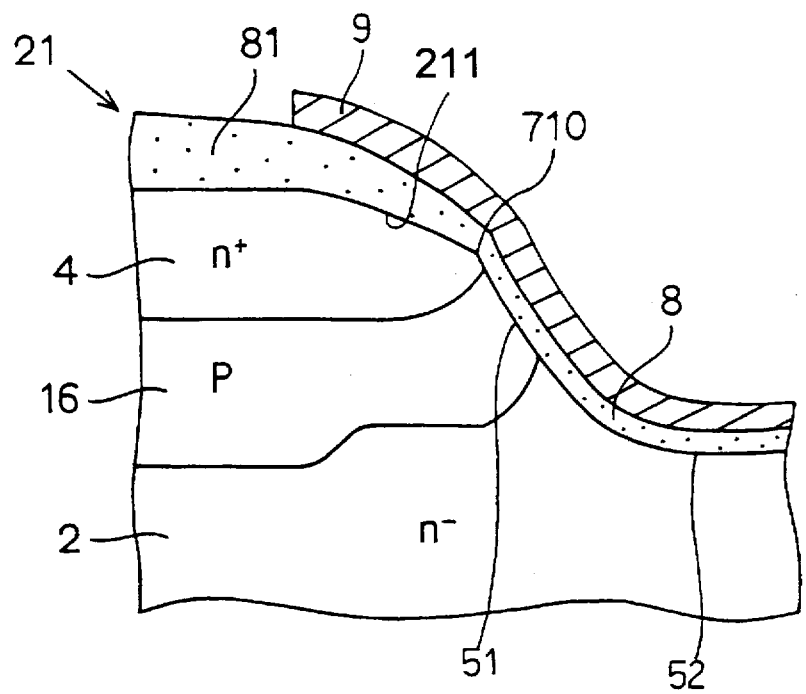
FIG. 2 is an enlarged view of the vertical type power MOSFET indicated in FIGS. 1A and 1B.

FIG. 1A is a plan view of a vertical type power MOSFET made up of square unit cells, and FIG. 1B is a sectional view taken along line IB—IB of FIG. 1A. FIG. 2 is an enlarged view indicating a characteristic portion of this invention shown in FIG. 1B. FIG. 2 indicates a concave gate structure of the embodiment and shows, in particular, a characteristic structure of a gate insulating film which is composed of a gate oxide film 8 (a portion corresponding to a channel formation region) and a gate oxide film 81 (a portion corresponding to an inlet part of a concavity); concrete indication for other portions are omitted.

As shown in FIG. 1A, the essential part, i.e., the unit-cell portion, of the vertical type power MOSFET according to this embodiment is so constructed that numerous unit cells 15 are laid out lengthwise and breadthwise at a pitch (unit-cell dimension) of a.

In FIG. 1B, a wafer 21 (corresponding to a semiconductor substrate) is structured by an n⁻-type epitaxial layer 2 having an impurity concentration of approximately $10^{16}$ cm$^{-3}$ and a thickness of approximately 7 μm on a semiconductor substrate 1 consisting of n⁺-type silicon having an impurity concentration of approximately $10^{20}$ cm$^{-3}$ and a thickness of 100 to 300 μm. Accordingly, a unit cells 15 is formed on a main surface of this wafer 21 with a unit-cell dimension a of approximately 12 μm.

A p-type body region 16 having a junction depth of approximately 3 μm is formed on the main-surface side of the wafer 21, and an n⁺-type source region 4 having a junction depth of approximately 1 μm is formed within this p-type body region 16.

Accordingly, a U-groove 50 (groove structure) is formed on the main-surface side of the wafer 21. As shown in FIG. 2, the U-groove 50 is made up of a slanting inlet portion 211 where the semiconductor surface gradually sinks from the main surface of the wafer 21, a bottom surface 52 disposed to be deeper than the inlet portion 211 and having a predetermined depth from the main-surface side of the wafer 21, and a sidewall surface 51 continuously linking the inlet portion 211 and bottom surface 52. Herein, the U-groove 50 according to this embodiment has a bathtub configuration wherein the sidewall surface 51 is canted with respect to the main surface, the slanting inlet portion 211 and sidewall surface 51 are inflectionally connected via a curving portion 710 having a small radius of curvature, and moreover the sidewall surface 51 and bottom surface 52 are smoothly connected by a concavely-curved surface. Herein, as shown in FIG. 2, there exists the curving portion 710 (having a pointed configuration or a sharp configuration) with a small radius of curvature at the boundary of the slanting inlet portion 211 and sidewall surface 51 of the U-groove 50. Namely, the curving portion 710 is defined as an inflection point where the slanting inlet portion 211 and the sidewall surface 51 are non-linearly connected at a certain angle.

Additionally, as shown in FIG. 1B, a channel 5 is established at the sidewall 51 of the U-groove 50 within the p-type body region 16 by the formation of the $n^+$-type source region 4. Herein, the junction depth of the p-type body region 16 is determined at a depth which can prevent a destruction due to the breakdown at an edge portion 12 of the U-groove bottom. Furthermore, boron is priorly diffused in a central portion of the p-type body region 16 so that the junction depth of the central portion of the p-type body region 16 becomes deeper than the perimeter, and the p-type body region 16 is established so that a breakdown occurs at the bottom of the central portion of the p-type body region 16 when high voltage is applied between the drain and source.

A gate oxide film 8 is formed on the surface (innerwall) of the U-groove 50 and a portion of the main surface of the wafer 21. According to this embodiment, as shown in FIG. 2, a uniform gate oxide film 8 having a substantially uniform thickness of approximately 60 nm is formed on the bottom surface 52 and sidewall surface 51 of the U-groove 50, and a gate oxide film 81 the thickness of which gradually increases as closer to the main surface of the wafer 21 is formed extending from the curving portion 710 to the main surface of the wafer 21 through the slanting inlet portion 211. That is, the thickness of the gate oxide film at the inlet part of the U-groove 50 is caused to be thicker than the gate oxide film 8.

Because of this thickness distribution in the gate oxide film, curvature of the surface of the gate oxide film formed on an upper portion of the curving portion 710 becomes small (i.e., the radius of curvature becomes large), and an electric-field concentration at the gate oxide film on the curving portion 710 is alleviated, and the life-time of the gate oxide films 8 and 81 can be improved.

As shown in FIGS. 1B and 2, a gate electrode 9 composed of polycrystalline silicon having a thickness of approximately 400 nm is formed on these gate oxide films 8 and 81, and further an interlayer insulating film 18 made up of BPSG having a thickness of approximately 1 μm is formed thereabove.

Moreover, a $p^+$-type body contact region 17 having a junction depth of approximately 0.5 μm is formed at the central surface of the p-type body region 16, and a source electrode 19 formed on the interlayer insulating film 18 contacts ohmically the $n^+$-type source region 4 and $p^+$-type body contact region 17 via a contact hole formed in the interlayer insulating film 18. Additionally, a drain electrode 20 is formed so as to ohmically contact a rear surface of the semiconductor substrate 1.

A method of fabrication for this embodiment will be described hereinafter with reference to FIG. 3 through FIG. 23.

Figure 3:
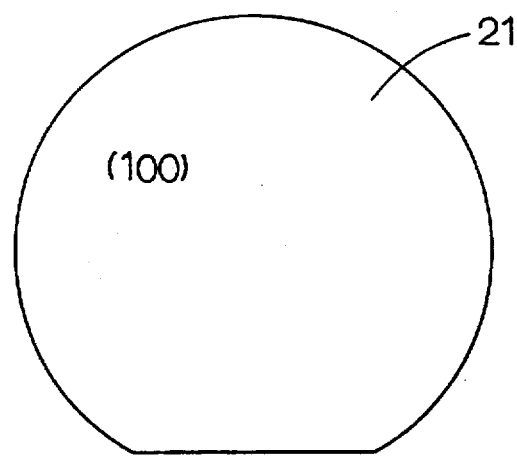
FIG. 3 is a plan view utilized for the explanation of a process of fabrication of the vertical type power MOSFET indicated in FIGS. 1A and 1B.
Figure 4:
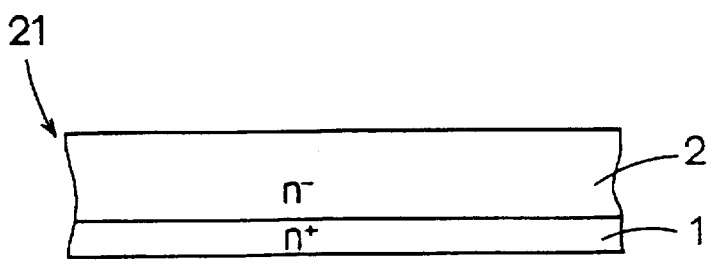
FIG. 4 is a sectional view utilized for the explanation of the process of fabrication of the vertical type power MOSFET indicated in FIGS. 1A and 1B.

Firstly, as shown in FIG. 3 and FIG. 4, a wafer 21 wherein an $n^-$-type epitaxial layer 2 has been caused to be grown on a main surface of a semiconductor substrate 1 made up of $n^+$-type silicon and having a plane orientation of (100) is prepared. This semiconductor substrate 1 has an impurity concentration of approximately $10^{20}$ cm$^{-3}$. Additionally, the epitaxial layer 2 has a thickness of approximately 7 μm, and an impurity concentration thereof is approximately $10^{16}$ cm$^{-3}$.

Figure 5:
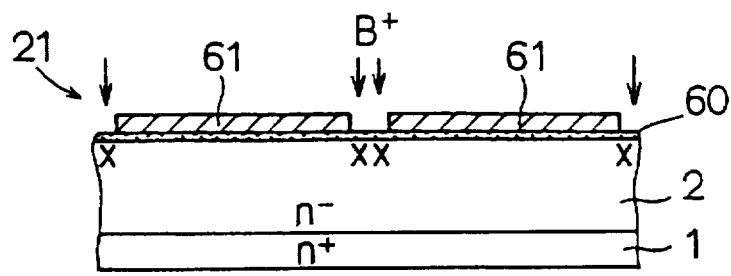
FIG. 5 is a sectional view utilized for the explanation of the process of fabrication of the vertical type power MOSFET indicated in FIGS. 1A and 1B.

Next, as shown in FIG. 5, the main surface of this wafer 21 is thermally oxidized to form a field oxide film and a pad oxide film 60 having a thickness of approximately 60 nm, and thereafter a resist film 61 is deposited and the resist film 61 is patterned with a pattern opening in a central portion of a prospective cell-forming location using a known photolithographic process. Accordingly, boron ($B^+$) is ion-implanted with this resist film 61 as a mask.

Figure 6:
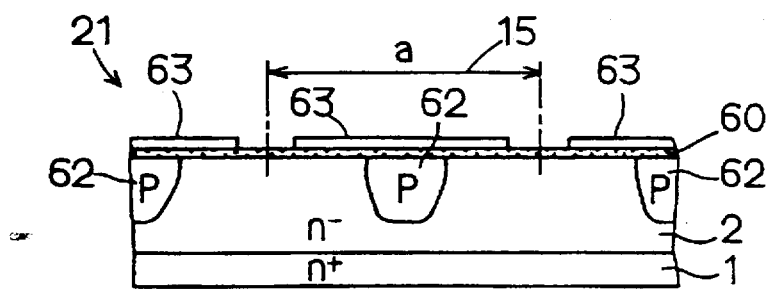
FIG. 6 is a sectional view utilized for the explanation of the process of fabrication of the vertical type power MOSFET indicated in FIGS. 1A and 1B.
Figure 7:
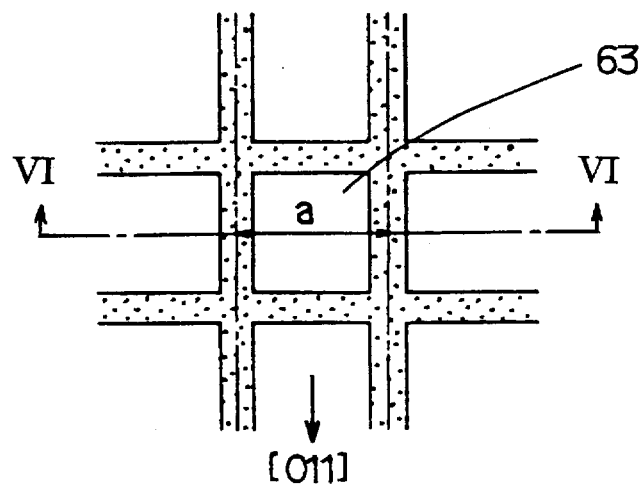
FIG. 7 is a plan view utilized for the explanation of the process of fabrication of the vertical type power MOSFET indicated in FIGS. 1A and 1B.

After peeling off the resist, a p-type diffusion region (deep well region) 62 having a junction depth of approximately 3 μm is formed as shown in FIG. 6 by thermal diffusion. This p-type diffusion region 62 ultimately becomes a portion of a p-type body region 16 which will be described later, fulfilling the object of causing ability to withstand surges to be improved by causing breakdown to occur stably at a bottom portion of the p-type diffusion region 62 when high voltage is applied between the drain and source. FIG. 6 is a sectional view of the wafer 21 wherein a silicon nitride film 63 has been patterned at intervals of the unit-cell dimension a for LOCOS oxidation. As shown in FIG. 6, the silicon nitride film 63 is deposited to approximately 200 nm on the main surface of the wafer 21, this silicon nitride film 63 is patterned as shown in FIG. 7 so as to become perpendicular and parallel in a <011> direction, and a lattice-like open pattern which is open with a pitch width (dimension of the unit cell 15) a is formed. This open pattern is aligned so that the above-described p-type diffusion region 62 is positioned in the central portion of the pitch interval thereof.

Figure 8:
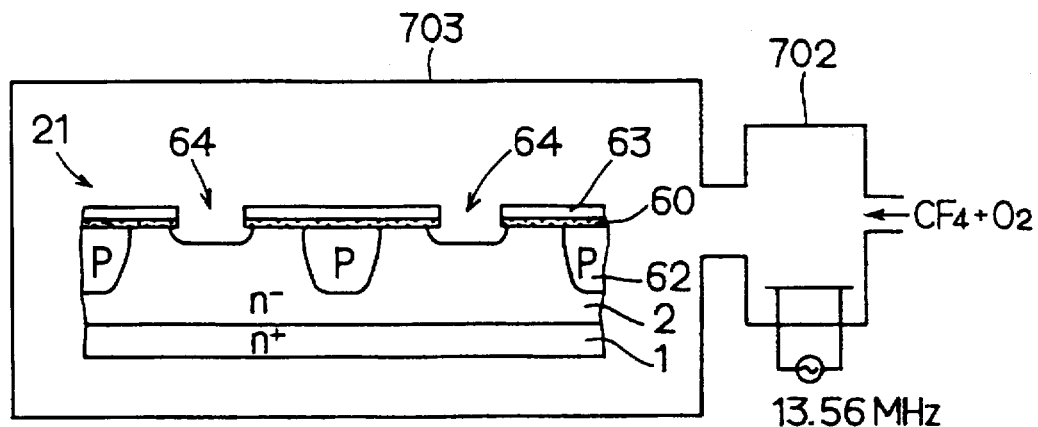
FIG. 8 is a schematic view utilized for the explanation of the process of fabrication of the vertical type power MOSFET indicated in FIGS. 1A and 1B.
Figure 9:
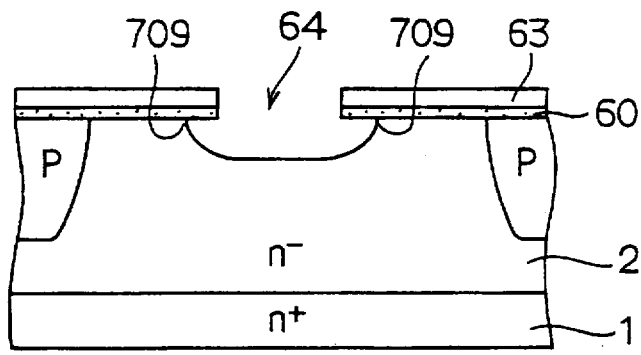
FIG. 9 is a sectional view utilized for the explanation of the process of fabrication of the vertical type power MOSFET indicated in FIGS. 1A and 1B.

Next, the pad oxide film 60 is etched with the silicon nitride film 63 as a mask, and in continuation, as shown in FIG. 8, a chemical dry etching (C.D.E.) is performed. That is to say, a plasma is caused to be generated in a discharge chamber 702 containing carbon tetrafluoride and oxygen gases, a chemically activated species are created, the activated species are transported to a reaction chamber 703, the $n^-$-type epitaxial layer 2 is isotropically etched by chemical dry etching which is isotropic etching in the reaction chamber 703, and an initial groove 64 is formed. Herein, the initial groove 64 has an entrance 709 which is substantially perpendicular (approximately 70° to 90°) with respect to the semiconductor-substrate surface, as shown in FIG. 9. At this time, as shown in FIG. 9, the entrance 709 formed by the semiconductor-substrate surface and a side surface of the resultant groove is particularly easily formed substantially at a right angle by etching employing a gas, such as dry etching, chemical dry etching, or the like. On the other hand, in case wet etching is employed, etchant is susceptible to pooling in the entrance 709 in the lower surface of the pad oxide film 60 as the etching mask due to surface tension of the etchant, and for this reason promotion of etching of the entrance 709 is facilitated and a radius of curvature tends not to become very small. According to this invention, however, effectiveness exists not merely for etching employing a gas, such as dry etching, chemical dry etching, or the like, but also for wet etching for the formation of the initial groove 64.

Figure 10:
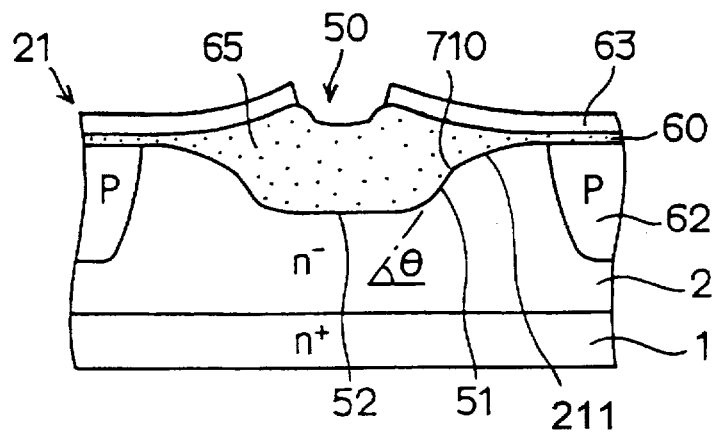
FIG. 10 is a sectional view utilized for the explanation of the process of fabrication of the vertical type power MOSFET indicated in FIGS. 1A and 1B.

Next, as shown in FIG. 10, the initial groove 64 portion is thermally oxidized with the silicon nitride film 63 as an oxidation mask. This is an oxidation method well-known as the LOCOS (local oxidation of silicon) method. A LOCOS oxide film 65 is formed by this oxidation; concurrently, a U-groove 50 structure is formed in the surface of the n⁻-type epitaxial layer 2 eroded by the LOCOS oxide film 65, and moreover the configuration of the groove 50 is fixed. At this time, as shown in the drawings, an inlet corner portion 709 (FIG. 9) formed by the chemical dry etching process remains as a curving part 710 at the boundary of the sidewall surface 51 of the groove and the inlet surface 211 corresponding to the bird's beak part of the LOCOS oxide film 65 (FIG. 10). At this time, conditions of chemical dry etching and conditions of LOCOS oxidation are selected so that the plane orientation of the channel-forming portion of the sidewall surface 51 of the U-groove 50 becomes a plane close to (111) ($\theta$=54.7°; preferably 55°±15°), as shown in the drawings.

In this way, the inner-wall surfaces of the U-groove 50 formed by LOCOS oxidation have a high flatness and few defects, and the surface thereof has a surface state which is similarly favorable as the initial main surface of the wafer 21 indicated in FIG. 2.

Figure 11:
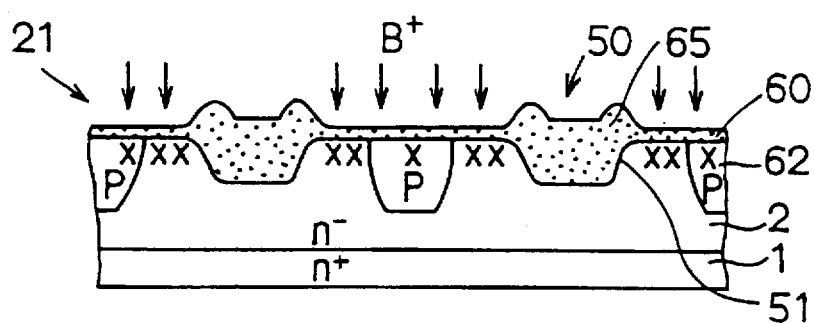
FIG. 11 is a sectional view utilized for the explanation of the process of fabrication of the vertical type power MOSFET indicated in FIGS. 1A and 1B.

Next, as shown in FIG. 11, boron (B⁺) for forming the p-type body region 16 (channel well region) is ion-implanted through the thin pad oxide film 60 with the LOCOS oxide film 65 as a diffusion mask. At this time, the boundary portion of the LOCOS oxide film 65 and the pad oxide film 60 assumes a self-alignment position, and the ion-implanted region is exactly defined.

Figure 12:
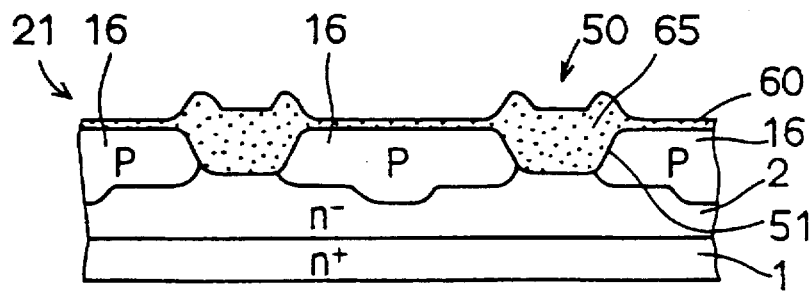
FIG. 12 is a sectional view utilized for the explanation of the process of fabrication of the vertical type power MOSFET indicated in FIGS. 1A and 1B.

Next, as shown in FIG. 12, thermal diffusion is performed to a junction depth of approximately 3 μm. Due to this thermal diffusion, the p-type diffusion region 62 priorly formed in the process indicated in FIG. 6 and the diffusion region implanted with boron ions in the process indicated in FIG. 11 are integrated, forming the single p-type body region 16, and both end surfaces of the p-type body region 16 are self-alignedly defined in the position of the sidewalls 51 of the U-groove 50.

Figure 13:
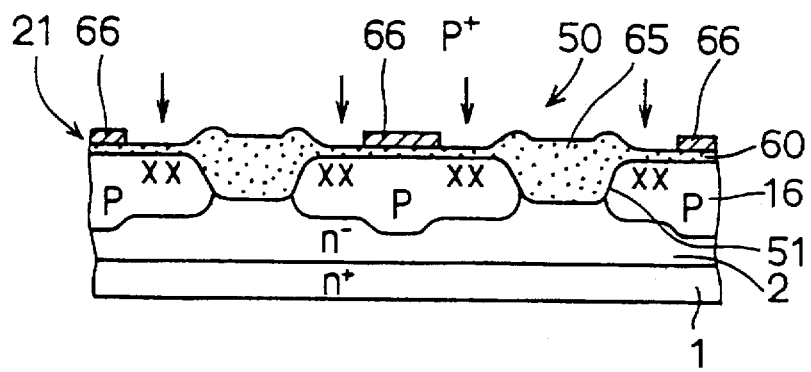
FIG. 13 is a sectional view utilized for the explanation of the process of fabrication of the vertical type power MOSFET indicated in FIGS. 1A and 1B.

Next, as shown in FIG. 13, phosphorus (P⁺) is ion-implanted through the thin pad oxide film 60 with both a resist film 66 patterned by a pattern left on the central portion of the surface of the p-type body region 16 surrounded by the LOCOS oxide film 65 formed on the surface of the wafer 21 by a lattice-like pattern and the LOCOS oxide film 65 to form the n⁺-type source region 4. In this way, as in the ion-implantation of boron in the process indicated in FIG. 11, the boundary portion of the LOCOS oxide film 65 and the pad oxide film 60 is coincided with a self-alignment position, and an ion-implantation region is exactly defined.

Figure 14:
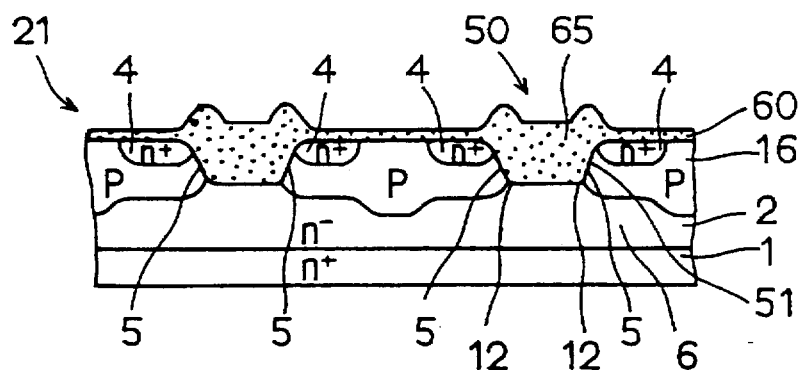
FIG. 14 is a sectional view utilized for the explanation of the process of fabrication of the vertical type power MOSFET indicated in FIGS. 1A and 1B.
Figure 15:
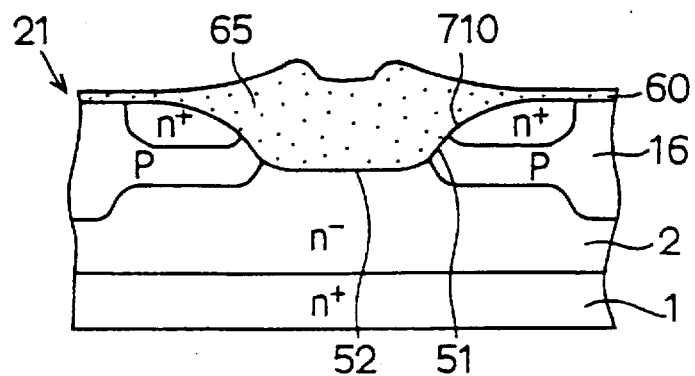
FIG. 15 is a sectional view utilized for the explanation of the process of fabrication of the vertical type power MOSFET indicated in FIGS. 1A and 1B.

Next, as shown in FIG. 14, the n⁺-type source region 4 is formed and concurrently the channel 5 is set up by thermal diffusion to a junction depth of 0.5 to 1 μm. As shown in FIG. 15, the junction depth obtained by this thermal diffusion is established to be deeper than the curving portion 710 formed by the foregoing formation for the LOCOS oxide film 65. In short, the n⁺-type source region 4 is self-alignedly defined by this thermal diffusion to be terminated at the sidewall surface 51 below the curving portion 710.

The junction depth and configuration of the p-type body region 16 are fixed by the foregoing processes of FIG. 11 through FIG. 14. An important matter in the configuration of this p-type body region 16 is that the position of the side surface (channel formation part) of the p-type body region 16 is defined by the sidewall surface 51 of the U-groove 50, self-aligned, and undergoes thermal diffusion, and so the configuration of the p-type body region 16 is perfectly bilaterally symmetrical with respect to the U-groove 50.

Figure 16:
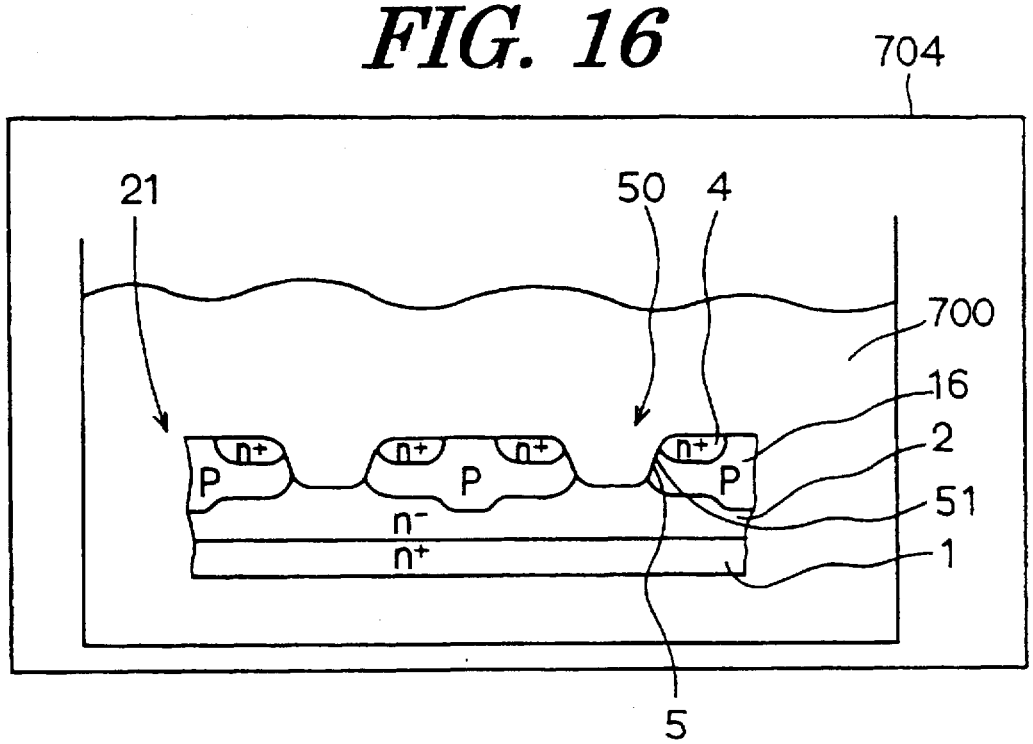
FIG. 16 is a schematic view utilized for the explanation of the process of fabrication of the vertical type power MOSFET indicated in FIGS. 1A and 1B.

Next, as shown in FIG. 16, the LOCOS oxide film 65 is etched away in an aqueous solution 700 containing hydrofluoric acid in a state wherein pH is adjusted to approximately 5 by ammonium fluoride while bonding the dangling bonds existing at the silicon surface with hydrogen, causing the inner-walls of the U-groove 50 to be exposed. In this etching process, light blocking is performed by a light-blocking cloth 704 so that light does not strike the surface on which the LOCOS oxide film 65 is formed.

Thereafter, the resultant wafer is removed from the aqueous solution 700 and dried in clean air.

Figure 17:
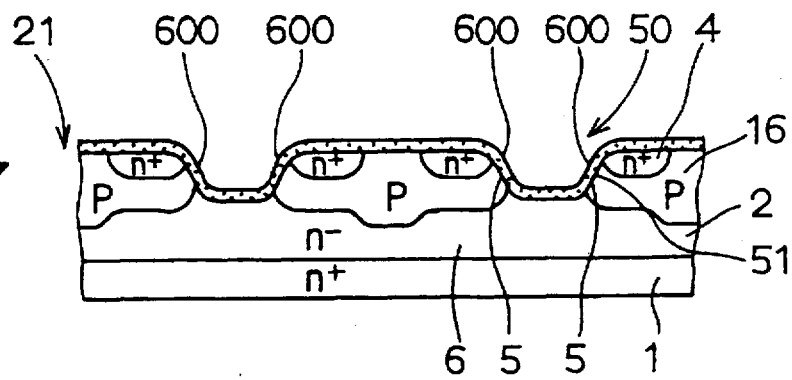
FIG. 17 is a sectional view utilized for the explanation of the process of fabrication of the vertical type power MOSFET indicated in FIGS. 1A and 1B.

Next, as shown in FIG. 17, a temporary oxide film 600 is formed on the sidewall surface 51 of the U-groove 50 (i.e., the surface of p-type body region 16 where channel 5 is to be disposed) until the (111) plane appears at the interface between the sidewall surface and the formed oxide film 600. The planarity of this surface where channel 5 is to be disposed is improved in terms of atomic order by this thermal-oxidation process.

Figure 18:
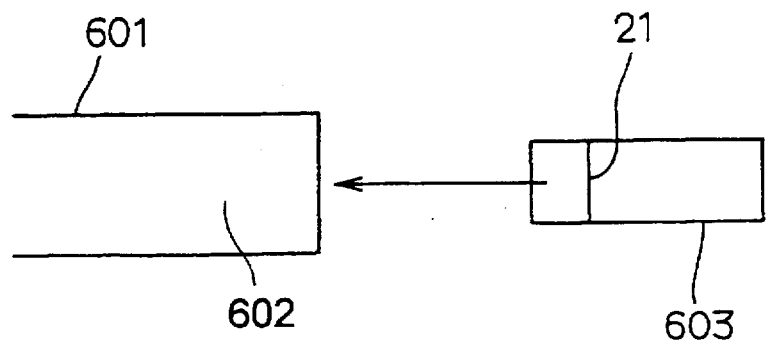
FIG. 18 is a schematic view utilized for the explanation of the process of fabrication of the vertical type power MOSFET indicated in FIGS. 1A and 1B.

This thermal-oxidation process is performed by gradually inserting a holder 603 wherein the wafer 21 is fixed into an oxidizing furnace 601 maintained in an oxygen atmosphere 602 and maintained at approximately 1,000° C., as shown in FIG. 18. By doing this, an initial period of oxidation is performed at a comparatively low temperature, and so the scattering of the impurities in the p-type body region 16 and the n⁺-type source region 4 to an external portion of the wafer during the oxidizing process is suppressed.

Figure 19:
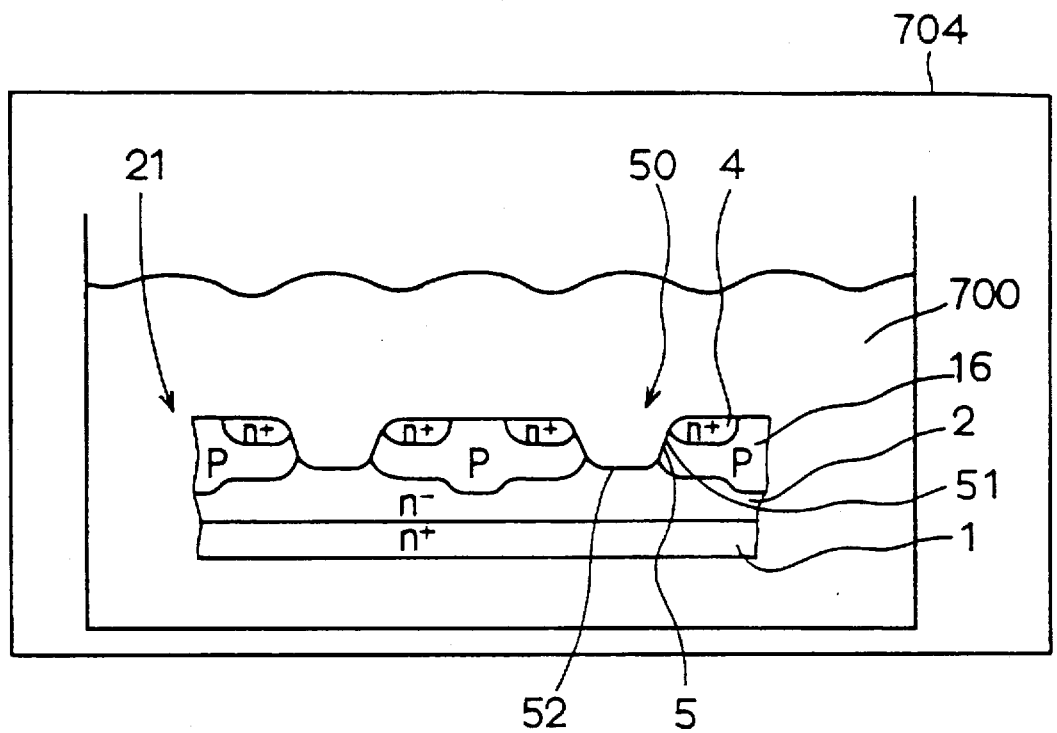
FIG. 19 is a schematic view utilized for the explanation of the process of fabrication of the vertical type power MOSFET indicated in FIGS. 1A and 1B.

Next, as shown in FIG. 19, this oxide film 600 is etched away. The etching of this oxide film 600 is also performed in an aqueous solution 700 containing hydrofluoric acid in a state wherein pH is adjusted to approximately 5 by ammonium fluoride while finishing the exposed silicon surface with hydrogen, similarly to the etching of the LOCOS oxide film of FIG. 16. The inner-wall of the U-groove 50 formed by this method is a favorable silicon surface with high planarity and few defects.

Figure 20:
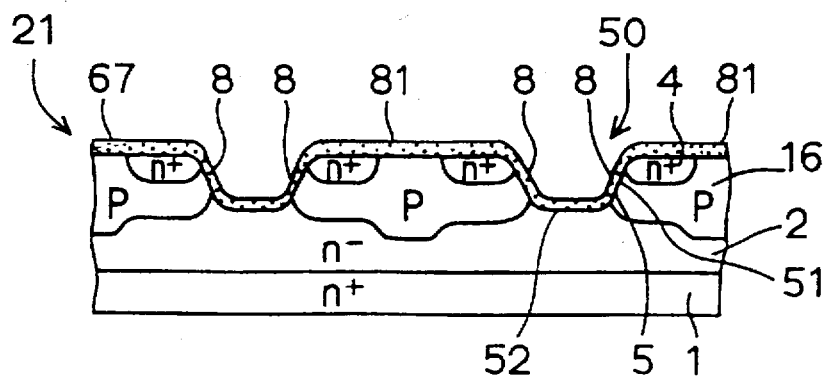
FIG. 20 is a sectional view utilized for the explanation of the process of fabrication of the vertical type power MOSFET indicated in FIGS. 1A and 1B.

In continuation, as shown in FIG. 20, a gate oxide film 8 having a thickness of approximately 60 nm is formed on the sidewall surface 51 and bottom surface 52 of the U-groove 50 by thermal oxidation. This oxidation process is performed by gradually inserting the wafer 21 into the oxidizing furnace 601 maintained in an oxygen atmosphere 602 and maintained at approximately 1,000° C., similarly to the above-described process indicated in FIG. 18. By doing this, as an initial period of oxidation is performed at a comparatively low temperature, the scattering of the impurities in the p-type body region 16 and the n⁺-type source region 4 to an external portion of the wafer during the oxidizing process is suppressed. The film quality of the gate oxide film 8, interface state density of the interface where channel 5 is formed, and carrier mobility are as favorable as a conventional planar type DMOS transistor. Herein, thickness of the gate oxide film 8 is formed to be thicker at the groove-opening side than the groove-bottom side, with the curving portion 710 as a boundary. This is because of accelerated oxidation due to the impurity. That is to say, this is because oxidation speed is faster for silicon heavily-implanted with an impurity than unimplanted or lightly-implanted silicon.

Figure 21:
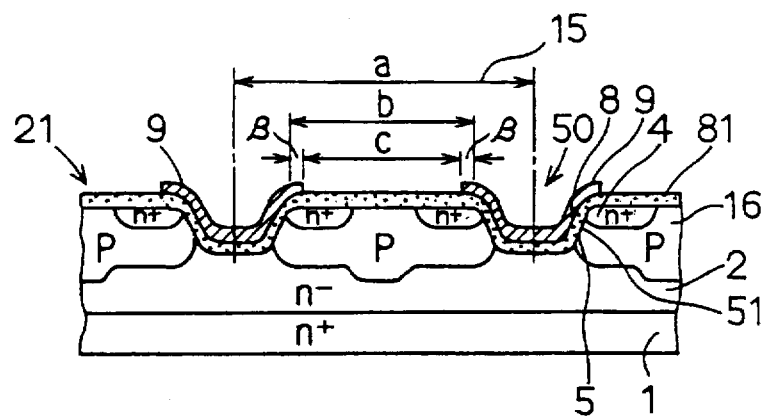
FIG. 21 is a sectional view utilized for the explanation of the process of fabrication of the vertical type power MOSFET indicated in FIGS. 1A and 1B.

Next, as shown in FIG. 21, a gate electrode 9 is formed by depositing a polycrystalline silicon film on the main surface of the wafer 21 to a thickness of approximately 400 nm and patterning the polycrystalline silicon film so as to be separated by a distance c which is shorter by 2μ than a distance b between two mutually adjacent U-grooves 50. Next, the gate oxide film 8, i.e., a surface portion 81, is further oxidized with the patterned gate electrode as an oxidation mask so as to be thicker at the end portion of the gate electrode 9.

As is indicated in FIG. 11 through FIG. 21, the p-type body region 16, the $n^+$-type source region 4, and the channel 5 are formed by using the LOCOS oxide film 65 as a mask for self-alignment type double diffusion, then after the LOCOS oxide film 65 has been etched away, the gate oxide films 8 and 81 and the gate electrode 9 are formed.

Figure 22:
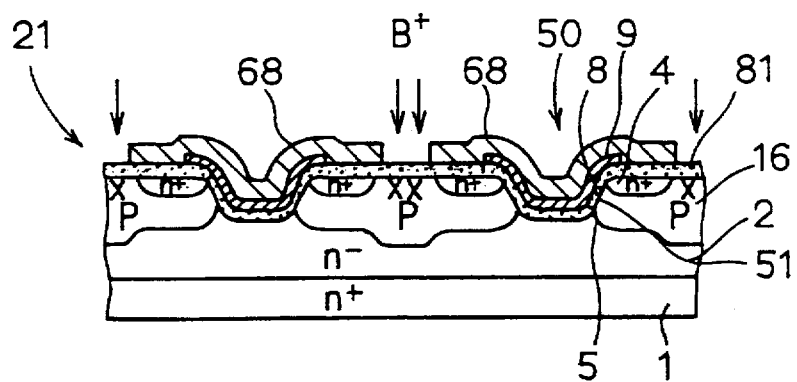
FIG. 22 is a sectional view utilized for the explanation of the process of fabrication of the vertical type power MOSFET indicated in FIGS. 1A and 1B.
Figure 23:
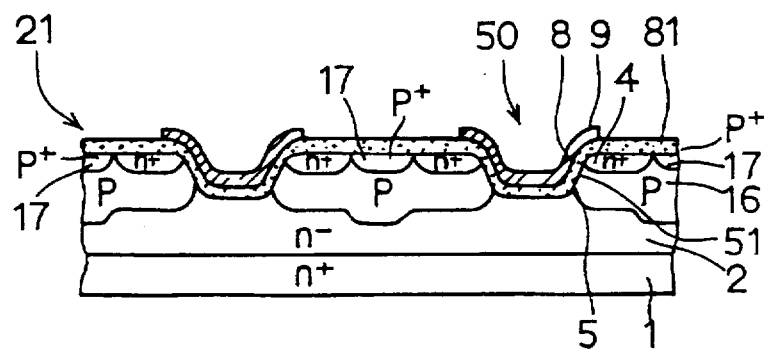
FIG. 23 is a sectional view utilized for the explanation of the process of fabrication of the vertical type power MOSFET indicated in FIGS. 1A and 1B.

Next, as shown in FIG. 22, boron for forming a $p^+$-type body contact region 17 is ion-implanted through a gate oxide film 81 with a patterned resist film 68 as a mask. Further, as shown in FIG. 23, the $p^+$-type body contact region 17 is formed to a junction depth of approximately 0.5 μm by thermal diffusion.

Accordingly, as shown in FIG. 1B, an interlayer insulating film 18 is formed with a BPSG on the main surface of the wafer 21, and contact holes are made in portions of the interlayer insulating film 18 to expose the $p^+$-type body contact region 17 and the $n^+$-type source region 4. Furthermore, a source electrode 19 is formed with an aluminum film, and ohmic contact is made between the source electrode 19 and the $p^+$-type body contact region 17 and $n^+$-type source region 4 through the contact hole. Moreover, a passivation film (not illustrated) made up of silicon nitride or the like for protecting the aluminum film is formed by the CVD (chemical vapor deposition) technique or the like. A drain electrode 20 of three layers comprising a Ti film, a Ni film, and an Au film is formed on a rear surface of the wafer 21, and ohmic contact is made between the drain electrode 20 and the $n^+$-type semiconductor substrate 1.

According to this embodiment of the present invention, the groove portion has the curving portion 710 at the boundary of the slanting inlet portion 211 (a portion defined by the erosion due to the bird's beak of the LOCOS oxide film 65) and the sidewall surface 51 (a surface defined by the side portion of the LOCOS oxide film 65), and moreover, the gate oxide film formed on the inner-wall of the groove 50 is made up of a gate oxide film 8 (uniform thickness part) formed on the bottom surface and sidewall surface (channel formation region) 51 of the groove portion, and a gate oxide film 81 (thick thickness part) formed to extend from the curving portion 710 to the main surface through the slanting inlet portion 211. In this embodiment, since film thickness of the gate oxide film 81 is greater than film thickness of the gate oxide film 8, with the curving portion 710 as a boundary, curvature of the surface of the gate oxide film formed on an upper portion of the curving portion 710 becomes small, and electrical-field concentration in the gate oxide film at the curving portion 710 is alleviated, and so reduction in breakdown voltage between the U-groove surface including the curving portion 710 and the gate electrode 9 can be prevented. As a result, the life-time of the gate oxide films 8 and 81 can be improved.

Furthermore, since the gate oxide film 81 (entrance part) becomes gradually thicker as the surface of the wafer 21 is approached from the curving portion 710 (i.e., moving away from the curving portion 710), curvature of the surface of the gate oxide film 81 becomes small, and electrical-field concentration in the gate oxide films 8 and 81 around the curving portion 710 is alleviated, and so the life-time of the gate insulating film can be improved. Moreover, since the gate oxide film 8 formed on the sidewall surface 51 has a substantially uniform thickness, local reduction of the gate-to-source breakdown voltage or the gate-to-body breakdown voltage can be prevented, and the life-time of the gate oxide film 8 can be improved.

Additionally, when seen in a different way, the groove portion has the curving portion 710 at the boundary of the slanting inlet portion 211 and the sidewall surface 51, and the gate insulating film, i.e., the gate oxide films 8 and 81, formed on the groove-surface has a first interface contiguous with the silicon surface of the groove portion and a second interface of the gate electrode side which is an opposite side to the first interface side. Herein, since the radius of curvature around the curving portion 710 on the second interface is established to be greater than the radius of curvature of the portion contiguous to the curving portion 710 on the first interface, electrical-field concentration in the gate insulating film at the curving portion is alleviated, and the life-time of the gate insulating film can be improved.

Further, the groove portion has a bathtub configuration, that is to say, the sidewall surface 51 having the portion which becomes the channel region 5 is canted with respect to the main surface, the inlet portion and the sidewall surface 51 are connected by, if anything, a convexly-curved surface, and the sidewall surface 51 and the bottom surface 52 are connected via a concavely-curved surface. Because of this, a decline in the degree of carrier mobility at the channel is prevented and the ON-resistance is caused to be reduced, and along with this, electrical-field concentration at the boundary of the inlet portion and the sidewall surface 51 and at the boundary of the sidewall surface 51 and the bottom surface 52 is alleviated, and so breakdown voltages at these roundly connected portions are enhanced, and the life-time of the gate insulating film can be improved.

Moreover, since the sidewall surface of the initial groove 64 (FIGS. 8 and 9) has an angle of 70° to 90° with respect to the main surface, a secondary groove portion for formation of the channel 5 can be shaped so that a sidewall surface 51 of a predetermined oblique angle can easily be formed by LOCOS oxidation.

Still further, the channel region 5 is disposed in a region having a depth greater than the curving portion 710 caused during the foregoing initial groove formation and left on the sidewall surface 51 after the above-described LOCOS oxidation. Because of this, the channel region 5 wherein electrons are flowing in an extremely thin inversion layer becomes flat, turbulence in the electron flow due to a curvature effect can be prevented, and a low ON-voltage is obtained.

Moreover, the U-groove 50 is formed by forming the initial groove 64 having the sidewall surface substantially perpendicular to the main surface by means of isotropic etching, selectively oxidizing the initial groove 64 by means of LOCOS oxidation to form the LOCOS oxide film 65 having a predetermined thickness, and thereafter etching away the LOCOS oxide film 65, and thus, crystal lattice defects at the sidewall surface 51 of the formed U-groove 50 which becomes the channel region 5 can be reduced, and thereby ON-resistance can be diminished. Herein, in case chemical dry etching is employed as isotropic etching to form the initial groove 64, not only can lattice defects at the sidewall surface 51 of the U-groove 50 be further reduced and ON-resistance be further diminished, but a plurality of the U-groove 50 can easily and uniformly be formed.

Because chemical dry etching etches the semiconductor surface by gas erosion, the vicinity of the entrance part of the initial groove 64 becomes sharp (substantially right angle) due to the vertically dug configuration thereof. In case a wet etching is employed as isotropic etching for forming the initial groove 64, etchant is susceptible to pooling in the entrance 709 beneath the overhanging pad oxide film 60 (FIG. 9) due to surface tension of the etchant, and for this reason promotion of etching of the entrance 709 is facilitated and uniform etching in the wafer tends not to be obtained. Although the undesirably formed curving portion 710, however, originates from the vertically dug initial groove 64 formed by means of chemical dry etching, since the radius of curvature of the surface of the entirety of the insulating film formed on the upper portion of the curving portion 710 is controlled to be small according to the embodiment, electrical-field concentration in the gate oxide films 8 and 81 around the curving portion 710 can be alleviated, and the life-time of the gate oxide films 8 and 81 can be improved.

In the above-described embodiment, a lattice-like pattern was employed for describing the present invention. The present invention, however, is not exclusively limited to the lattice-like pattern, but may be applied to, for example, a stripe-like pattern as well, and same effect as the lattice-like pattern can be obtained. Furthermore, the present invention is not limited to a vertical type MOSFET, but may be applied to another gate construction such as a power MOS-IC with an incorporation of the MOSFET referred to hereinabove and an IGBT (insulated gate bipolar transistor). In addition, in the foregoing embodiment, description was made of only the n-type channel, but needless to say, the present invention can obtain the same effect as the n-type channel by a p-type channel in which the semiconductor type (n-type in the above description) is replaced with p-type.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor device comprising:
   a semiconductor substrate having a first conductivity type semiconductor layer at a side of a main-surface thereof, said semiconductor layer having a groove structure which is disposed at said main-surface and has a bottom part, a slanting inlet part where said main-surface of said semiconductor layer sinks gradually to said bottom part, and a sidewall part forming a sidewall of said groove structure and joining said slanting inlet part and said bottom part, wherein a curving portion where said slanting inlet part and said sidewall part are inflectionally connected is formed at a boundary of said slanting inlet part and said sidewall part;
   a gate insulating film formed along said groove structure; and
   a gate electrode disposed along said groove structure and on said gate insulating film,
   wherein said gate insulating film has a first interface defined with an inner surface of said groove structure and a second interface defined with a lower surface of said gate electrode; and
   wherein said gate insulating film is formed such that a radius of curvature in a vicinity of said curving portion on said second interface is controlled to be larger than a radius of curvature of a portion contiguous to said curving portion on said first interface.

2. A semiconductor device according to claim 1, wherein said gate insulating film has a first part formed to extend from said curving portion to said slanting inlet part of said groove structure and a second part formed on said sidewall part of said groove structure, said first part of said gate insulating film having a thickness thicker than a thickness of said second part of said gate insulating film.

3. A semiconductor device according to claim 2, wherein said first part of said gate insulating film is formed continuously with said second part of said gate insulating film.

4. A semiconductor device according to claim 2, wherein said first part of said gate insulating film becomes gradually thicker as a portion of said first part of said gate insulating film moves away from said curving portion to said main-surface.

5. A semiconductor device according to claim 3, wherein said first part of said gate insulating film becomes gradually thicker as a portion of said first part of said gate insulating film moves away from said curving portion to said main-surface.

6. A semiconductor device according to claim 2, wherein said second part of said gate insulating film has a substantially uniform thickness.

7. A semiconductor device according to claim 4, wherein said second part of said gate insulating film has a substantially uniform thickness.

8. A semiconductor device according to claim 1, wherein a MOS transistor structure is formed so that a body region of a second conductivity type is disposed to contact said sidewall part of said groove structure and a source region of said first conductivity type is disposed within said body region to define a channel at said sidewall part of said groove structure.

9. A semiconductor device according to claim 2, wherein a MOS transistor structure is formed so that a body region of a second conductivity type is disposed to contact said sidewall part of said groove structure and a source region of said first conductivity type is disposed within said body region to define a channel at said sidewall part of said groove structure.

10. A semiconductor device according to claim 4, wherein a MOS transistor structure is formed so that a body region of a second conductivity type is disposed to contact said sidewall part of said groove structure and a source region of said first conductivity type is disposed within said body region to define a channel at said sidewall part of said groove structure.

11. A semiconductor device according to claim 6, wherein a MOS transistor structure is formed so that a body region of a second conductivity type is disposed to contact said sidewall part of said groove structure and a source region of said first conductivity type is disposed within said body region to define a channel at said sidewall part of said groove structure.

12. A semiconductor device according to claim 8, wherein said source region has a junction depth which makes a pn junction between said source and body regions terminating at a portion deeper than said curving portion on said sidewall part of said groove structure.

13. A semiconductor device according to claim 1, wherein said sidewall of said groove structure is canted with respect to said main-surface of said semiconductor layer.

14. A semiconductor device according to claim 13, wherein said sidewall part and said bottom part are connected via a concavely curved surface.

15. A semiconductor device according to claim 1, wherein a plane orientation of said semiconductor substrate is a (100) plane.

16. A semiconductor device according to claim 8, wherein a plane orientation of said semiconductor substrate is a (100) plane.

17. A semiconductor device according to claim 1, wherein said groove portion is formed by: forming, through etching, an initial groove having an entrance substantially perpendicular to said main-surface; selectively oxidizing said initial groove to form a locally oxidized film; and removing said locally oxidized film.

18. A semiconductor device according to claim 17, wherein said etching for forming said initial groove is isotropic etching.

19. A semiconductor device according to claim 17, wherein a side surface of said initial groove has an angle of 70° to 90° with respect to said main-surface.

20. A semiconductor device according to claim 17, wherein said etching for forming said initial groove is chemical dry etching.

21. A semiconductor device comprising:

a semiconductor substrate having a semiconductor layer of a first conductivity type, a surface of said semiconductor layer being a main surface, said semiconductor layer having a groove structure, which is made up of a slanting inlet portion becoming gradually deeper from said main surface of said semiconductor layer, a bottom surface and a sidewall surface joining said slanting inlet portion and said bottom surface, wherein a curving portion inflectionally curved is disposed at a boundary of said slanting inlet portion and said sidewall surface;

a gate insulating film formed along said groove structure and having a first surface contiguous to an inner wall of said groove structure and a second surface on a rear surface of said first surface, wherein a radius of curvature around said curving portion on said second surface is larger than a radius of curvature of a portion contiguous to said curving portion on said first surface; and a MOS transistor structure made up of a gate electrode disposed on said gate insulating film, a body region formed on said sidewall surface of said groove structure, a source region formed within said body region, and a drain electrode connected to said semiconductor substrate.

22. A semiconductor device comprising:

a semiconductor substrate having a semiconductor layer of a first conductivity type, a surface of said semiconductor layer being a main surface, said semiconductor layer having a groove structure, which is made up of a slanting inlet portion becoming gradually deeper from said main surface of said semiconductor layer, a bottom surface and a sidewall surface joining said slanting inlet portion and said bottom surface, wherein a curving portion inflectionally curved is disposed at a boundary of said slanting inlet portion and said sidewall surface;

a gate insulating film which is made up of a first part formed on said bottom surface and said sidewall surface of said groove structure and a second part formed to extend from said curving portion to said slanting inlet portion, said second part of said gate insulating film having a film thickness greater than said first part of said gate insulating film; and a MOS transistor structure made up of a gate electrode disposed at least on said first part of said gate insulating film, a body region formed on said sidewall surface of said groove structure, a source region formed within said body region, and a drain electrode connected to said semiconductor substrate.

* * * * *

UNITED STATES PATENT AND TRADEMARK OFFICE
CERTIFICATE OF CORRECTION

PATENT NO. : 5,747,851

DATED : May 5, 1998

INVENTOR(S) : TOMATSU et al.

It is certified that error appears in the above-identified patent and that said Letters Patent is hereby corrected as shown below:

On the title page, item [54] and col. 1, line 2

<u>IN THE TITLE</u>:

Read "Reduced" as -- HIGH --

Signed and Sealed this

Ninth Day of March, 1999

Attest:

Q. TODD DICKINSON

*Attesting Officer*     *Acting Commissioner of Patents and Trademarks*